US009608590B2

(12) United States Patent
Hamner et al.

(10) Patent No.: US 9,608,590 B2
(45) Date of Patent: Mar. 28, 2017

(54) CABLE ASSEMBLY HAVING A SIGNAL-CONTROL COMPONENT

(71) Applicant: Tyco Electronics Corporation, Berwyn, PA (US)

(72) Inventors: Richard Elof Hamner, Hummelstown, PA (US); Justin Dennis Pickel, Hummelstown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/546,003

(22) Filed: Nov. 18, 2014

(65) Prior Publication Data

US 2016/0142030 A1    May 19, 2016

(51) Int. Cl.
*H01B 7/02* (2006.01)
*H03H 7/01* (2006.01)
*H01B 11/00* (2006.01)
*H04B 3/30* (2006.01)
*H01R 13/66* (2006.01)

(52) U.S. Cl.
CPC ............. *H03H 7/0115* (2013.01); *H01B 7/02* (2013.01); *H01B 11/002* (2013.01); *H04B 3/30* (2013.01); *H01R 13/6658* (2013.01)

(58) Field of Classification Search
USPC ........................................ 174/70 R; 439/578
See application file for complete search history.

(56) References Cited

U.S. PATENT DOCUMENTS

| 3,824,431 | A | * | 7/1974 | Schlicke | ................ | H02H 9/005 |
| | | | | | | 338/21 |
| 3,826,861 | A | * | 7/1974 | Karl | ...................... | H01R 4/188 |
| | | | | | | 174/84 C |
| 4,239,319 | A | * | 12/1980 | Gladd | ................ | H01R 13/6641 |
| | | | | | | 439/620.21 |
| 7,113,002 | B2 | * | 9/2006 | Otsuka | ..................... | H01P 3/02 |
| | | | | | | 174/74 R |
| 2007/0229200 | A1 | * | 10/2007 | Lee | .......................... | H01P 1/227 |
| | | | | | | 333/81 A |
| 2010/0029104 | A1 | * | 2/2010 | Patel | .................. | H01R 13/6658 |
| | | | | | | 439/76.1 |
| 2014/0148056 | A1 | * | 5/2014 | Smith | ................ | H01R 13/6658 |
| | | | | | | 439/620.22 |

* cited by examiner

*Primary Examiner* — Timothy Thompson
*Assistant Examiner* — Krystal Robinson

(57) ABSTRACT

Cable assembly includes a communication cable having first and second insulated wires. Each of the first and second insulated wires has a signal conductor and an insulation layer that surrounds the signal conductor. The cable assembly also includes a circuit carrier that is coupled to the communication cable and has first and second signal pathways. Each of the first and second signal pathways includes a leading conductive surface and a trailing conductive surface that are separated from each other. The signal conductors of the first and second insulated wires are coupled to the trailing conductive surfaces of the first and second signal pathways, respectively. Each of the first and second signal pathways includes a corresponding signal-control component that electrically couples the separated leading and trailing conductive surfaces.

20 Claims, 7 Drawing Sheets

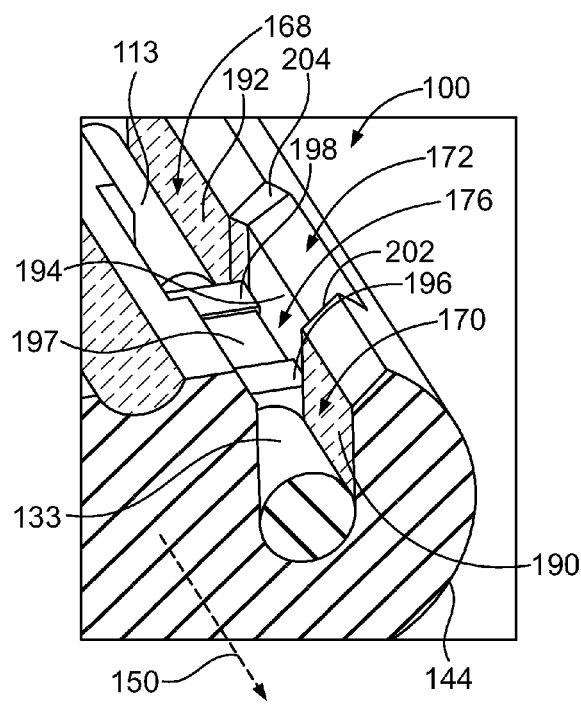
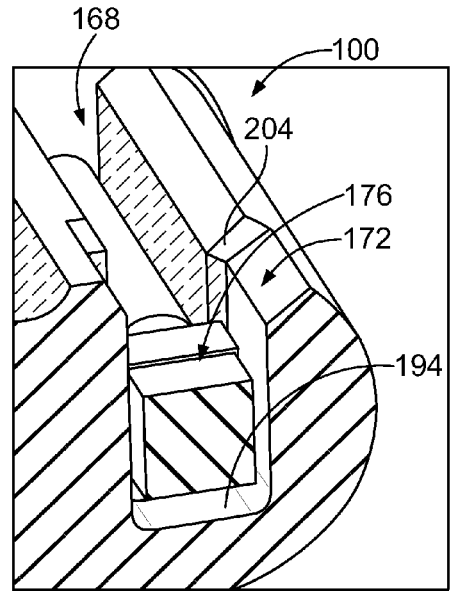
FIG. 4          FIG. 5
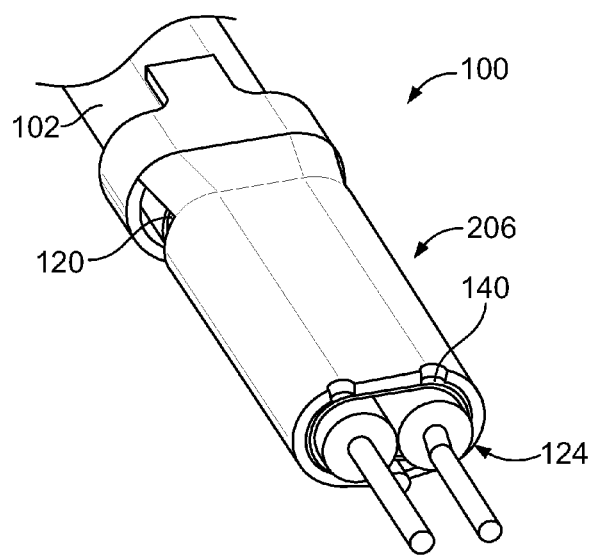
FIG. 6

CABLE ASSEMBLY HAVING A SIGNAL-CONTROL COMPONENT

BACKGROUND

The subject matter herein relates generally to cable assemblies having signal conductors for communicatively coupling different components of a communication system.

Communication systems, such as networking and telecommunication systems, use electrical connectors and cable assemblies to communicatively couple different components of the communication systems. For example, a plurality of daughter card assemblies may include the electrical connectors and may be attached to a cable backplane. Each cable assembly may include two or more cable connectors that are communicatively coupled to one another through communication cables. The cable connectors mate with corresponding electrical connectors of the daughter card assemblies thereby communicatively coupling different daughter card assemblies. The electrical connectors, the corresponding daughter card assemblies, and the cable assemblies may form multiple signal pathways of the communication system.

As speed and performance demands of the communication systems increase, it has become more difficult to sufficiently address signal loss and degradation issues. For instance, there has been a demand to increase the density of signal pathways to increase the throughput of the communication system. Moreover, there has been a general trend for smaller electrical components, including smaller electrical connectors. Increasing the density of signal pathways and/or decreasing the size of the electrical components, however, may render it more challenging to improve the speed and performance of the electrical connectors.

One known method for improving the performance of a communication system includes incorporating signal-control components along the signal pathways. Signal-control components, such as capacitors, inductors, or resistors, may be configured to: (a) control a flow of current along the signal pathway; (b) filter the signals along the signal pathway; (c) reduce reflections; and/or (d) reduce data transmission losses.

In some communication systems, the signal-control components may be embedded within the electrical connectors or the cable connectors. For example, a decoupling capacitor having opposite terminals may be coupled to separate conductors of an electrical connector. Each terminal of the decoupling capacitor is directly coupled to the corresponding conductor using a conductive epoxy. Such electrical connectors may be difficult and/or costly to manufacture due to the small size of the conductors and the decoupling capacitors. It may also be difficult to accurately apply the conductive epoxy. In other communication systems, the decoupling capacitors are coupled to or formed within a printed circuit board. These decoupling capacitors, however, reduce available space along the printed circuit board and can also be difficult to manufacture.

Accordingly, there is a need for a communication system having signal-control components that are not located within an electrical connector or a printed circuit board of the communication system. Heretofore, cable assemblies having such signal-control components have not been proposed.

BRIEF DESCRIPTION

In an embodiment, a cable assembly is provided that includes a communication cable having first and second insulated wires. Each of the first and second insulated wires has a signal conductor and an insulation layer that surrounds the signal conductor. The cable assembly also includes a circuit carrier that is coupled to the communication cable and has first and second signal pathways. Each of the first and second signal pathways includes a leading conductive surface and a trailing conductive surface that are separated from each other. The signal conductors of the first and second insulated wires are coupled to the trailing conductive surfaces of the first and second signal pathways, respectively. Each of the first and second signal pathways includes a corresponding signal-control component that electrically couples the separated leading and trailing conductive surfaces.

In some embodiments, the cable assembly also includes first and second signal conductors that are coupled to the leading conductive surfaces of the first and second signal pathways, respectively. In certain embodiments, the first signal conductor, the signal conductor of the first insulated wire, and the signal-control component of the first signal pathway are substantially aligned with one another, and the second signal conductor, the signal conductor of the second insulated wire, and the signal-control component of the second signal pathway are substantially aligned with one another.

In an embodiment, a circuit carrier configured to couple to a communication cable is provided. The circuit carrier includes a carrier body and first and second signal pathways coupled to the carrier body. The first and second signal pathways have fixed positions with respect to each other. Each of the first and second signal pathways includes a leading conductive surface and a trailing conductive surface that are separated from each other. Each of the first and second signal pathways includes a corresponding signal-control component that electrically couples the separated leading and trailing conductive surfaces.

BRIEF DESCRIPTION OF THE DRAWINGS

FIG. 4 is a cross-sectional view of the cable assembly of FIG. 1.

FIG. 5 is another cross-sectional view of the cable assembly of FIG. 1.

FIG. 6 is a perspective view of the cable assembly of FIG. 1 including a cable ferrule that surrounds the circuit carrier.

DETAILED DESCRIPTION

Figure 1:
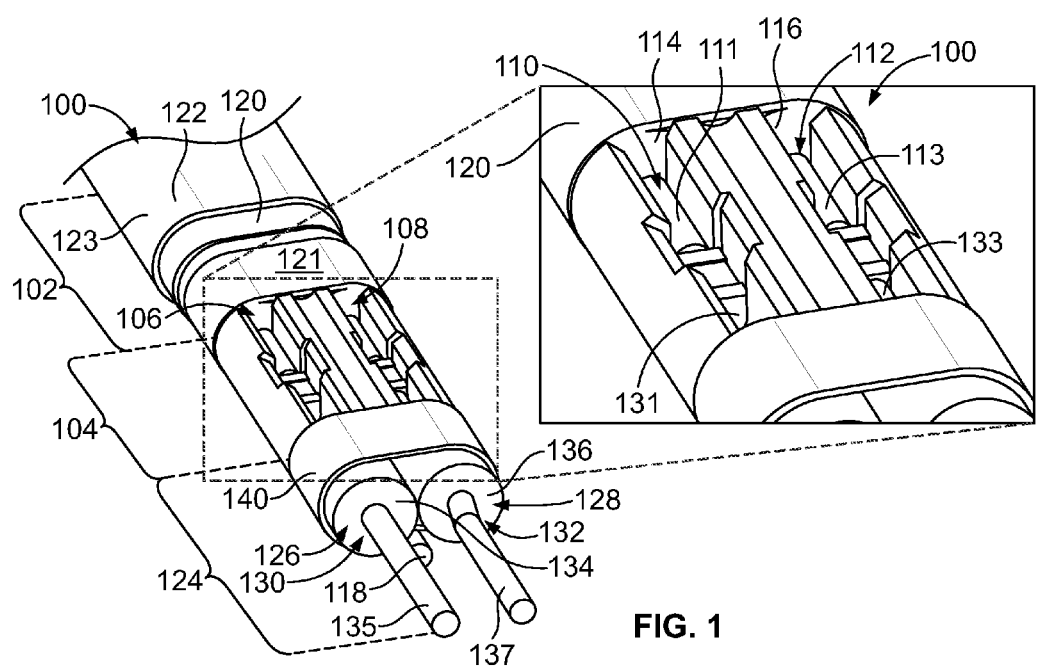
FIG. 1 illustrates a perspective view of a portion of a cable assembly formed in accordance with an embodiment including a circuit carrier.

Embodiments set forth herein include circuit carriers and cable assemblies including the same. The cable assemblies may include multiple signal pathways. The circuit carriers include signal-control components and are configured to form part of the signal pathways of the cable assemblies. The signal-control components may be configured to at least one of: (a) modulate the current/voltage along the corresponding signal pathways; (b) filter data signals along the corresponding signal pathways; (c) reduce reflections; or (d) reduce data transmission losses. The signal-control components may include, for example, capacitors, inductors, and resistors. In some embodiments, only one signal-control component of the circuit carrier is used for each signal pathway, but it is contemplated that more than one signal-control component may be used in other embodiments. In particular embodiments, the signal-control components include decoupling capacitors (also referred to as bypass capacitors).

The circuit carrier may be positioned in-line between a communication cable and a cable extension. In some embodiments, each of the communication cable and the cable extension includes first and second insulated wires that form a differential pair for high-speed differential signaling. The circuit carrier may electrically couple the first and second insulated wires of the communication cable to the first and second insulated wires of the cable extension, respectively. In such embodiments, the cable extension may be similar or identical to the communication cable. Accordingly, in some embodiments, the circuit carrier may electrically couple a first communication cable and a second communication cable.

In other embodiments, the cable extension includes first and second signal contacts having mating ends. The circuit carrier may electrically couple the first and second insulated wires of the communication cable to the first and second signal contacts of the cable extension, respectively. The mating ends of the first and second signal contacts may be configured to directly engage (or terminate to) corresponding electrical contacts of an electrical connector. In such embodiments, the cable extension may represent an end portion of the cable assembly.

The circuit carriers include signal pathways having separate conductive surfaces and a signal-control component that electrically couples the separate conductive surfaces. In order to differentiate similar elements, different labels may be used. For example, conductive surfaces may be referred to as leading or trailing conductive surfaces, downstream or upstream conductive surfaces, or first and second conductive surfaces. It should be understood, however, that such labels are used to only differentiate the conductive surfaces and do not require structural differences, unless otherwise noted. For example, the circuit carrier may include a leading conductive surface and a trailing conductive surface that are separated from or spaced apart from each other. The leading and trailing conductive surfaces may be similar to each other, but configured to engage different signal conductors. The signal-control component may extend between and electrically couple the separated leading and trailing conductive surfaces.

Figure 2:
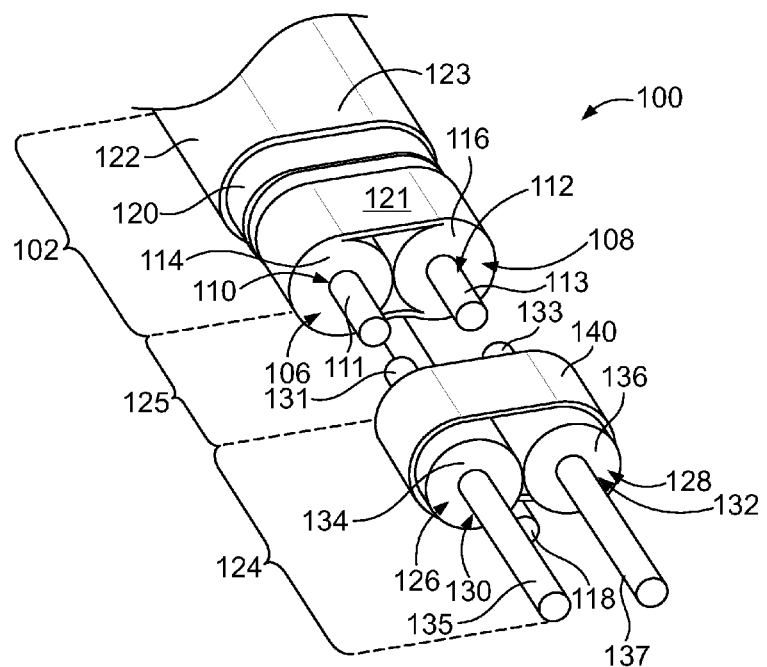
FIG. 2 is a perspective view of the portion of the cable assembly of FIG. 1 with the circuit carrier removed.

FIG. 1 is a perspective view of a portion of a cable assembly 100 having a communication cable 102 and a circuit carrier 104 coupled to the communication cable 102. FIG. 1 also includes an enlarged view of the cable assembly 100 to more clearly illustrate certain features and components of the cable assembly 100. FIG. 2 is a perspective view of the portion of the cable assembly 100 with the circuit carrier 104 removed. The cable assembly 100 may also include an optional cable extension 124. As shown in FIG. 2, a gap 125 extends between the communication cable 102 and the cable extension 124. The gap 125 is sized to receive the circuit carrier 104 (FIG. 1)

With respect to FIGS. 1 and 2, the communication cable 102 may be referred to as a multi-conductor cable and may include first and second insulated wires 106, 108. The first and second insulated wires 106, 108 include signal conductors 110, 112, respectively, and insulation layers 114, 116, respectively. The insulation layers 114, 116 surround the signal conductors 110, 112, respectively. The communication cable 102 may also include a drain wire or ground conductor 118.

In particular embodiments, the communication cable 102 may be referred to as a twin-axial cable or Twinax cable and have a parallel-pair configuration. For example, the first and second insulated wires 106, 108 may extend parallel to each other along a length of the communication cable 102. However, the configuration of the communication cable 102 shown in FIGS. 1 and 2 is just one example of the various configurations that the communication cable 102 may have. For instance, the first and second insulated wires 106, 108 may not extend parallel to each other and, instead, may form a twisted pair. In other embodiments, the communication cable 102 may include more than one pair of insulated wires, such as two pairs. In such alternative embodiments, the cable assembly 100 may include a single circuit carrier that is modified to accommodate two pairs of insulated wires. In other cases, the cable assembly 100 may include multiple circuit carriers.

The communication cable 102 may also include a shield layer 120 (or shield tape) that surrounds the first and second insulated wires 106, 108 and a cable jacket 122 that surrounds an outer surface 121 of the shield layer 120. The cable jacket 122 may also include an outer surface 123. The shield layer 120 may be, for example, a conductive foil that functions to shield the first and second insulated wires 106, 108 from electromagnetic interference (EMI). In an exemplary embodiment, the drain wire 118 extends along and is electrically coupled to the outer surface 121 of the shield layer 120. In other embodiments, the drain wire 118 may extend along and be electrically coupled to an inner surface of the shield layer 120. In the illustrated embodiment, the cable assembly 100 includes only a single drain wire 118. In other embodiments, however, the cable assembly 100 may include multiple drain wires.

The shield layer 120 and the cable jacket 122 may extend for substantially an entire length of the communication cable 102. In some embodiments, however, the shield layer 120 and the cable jacket 122 may not extend around the circuit carrier 104 (FIG. 1). For example, as shown in FIGS. 1 and 2, portions of the shield layer 120 and the cable jacket 122 may be removed to expose the insulated wires 106, 108. Portions of the insulation layers 114, 116 of the insulated wires 106, 108, respectively, may be removed to expose the corresponding signal conductors 110, 112, respectively. The exposed portions of the signal conductors 110, 112 that clear the insulation layers 114, 116, respectively, and extend into the gap 125 (FIG. 2) are hereinafter referred to as exposed segments 111, 113.

The circuit carrier 104 (FIG. 1) is configured to be positioned in-line between the communication cable 102 and the cable extension 124 and electrically couple the communication cable 102 and the cable extension 124. In the illustrated embodiment, the cable extension 124 may be similar or identical to the communication cable 102. For example, the cable extension 124 includes first and second insulated wires 126, 128 that may be similar or identical to the first and second insulated wires 106, 108, respectively.

The first and second insulated wires 126, 128 include signal conductors 130, 132, respectively, and insulation layers 134, 136, respectively, that surround the corresponding signal conductors 130, 132. Optionally, the cable extension 124 may include a shield layer 140 and a cable jacket (not shown) that may be similar or identical to the cable jacket 122. Similar to the communication cable 102, a portion of the shield layer 140 has been removed to expose the insulated wires 126, 128. Portions of the insulation layers 134, 136 have been removed to expose the signal conductors 130, 132, respectively. The exposed portions of the signal conductors 130, 132 that clear the insulation layers 134, 136, respectively, and extend into the gap 125 (FIG. 2) are hereinafter referred to as exposed segments 131, 133. The signal conductors 130, 132 may also include exposed segments 135, 137, respectively, that clear the insulation layers 134, 136 and extend away from the gap 125. The exposed segments 135, 137 may be configured, for example, to be terminated to other electrical elements (not shown).

In FIGS. 1 and 2, the cable extension 124 appears to have a length that is shorter than a length of the communication cable 102. The cable extension 124 and the communication cable 102 may have other lengths in other embodiments. For example, in alternative embodiments, the cable extension 124 and the communication cable 102 may have the same length or the cable extension 124 may have a length that is greater than the length of the communication cable 102.

In some embodiments, the communication cable 102 may be a first communication cable, and the cable extension 124 may be a second communication cable that is electrically coupled to the first communication cable through the circuit carrier 104. In such embodiments, the first and second communication cables may be different communication cables. Alternatively, the second communication cable may be a segment of the first communication cable. For instance, portions of the cable jacket 122, the shield layer 120, and the insulation layers 114, 116 may be removed to expose the signal conductors 110, 112, respectively. The signal conductor 110 may be sliced or cut to form the exposed segment 111 and the exposed segment 131, and the signal conductor 112 may be sliced or cut to form the exposed segment 113 and the exposed segment 133.

Figure 3:
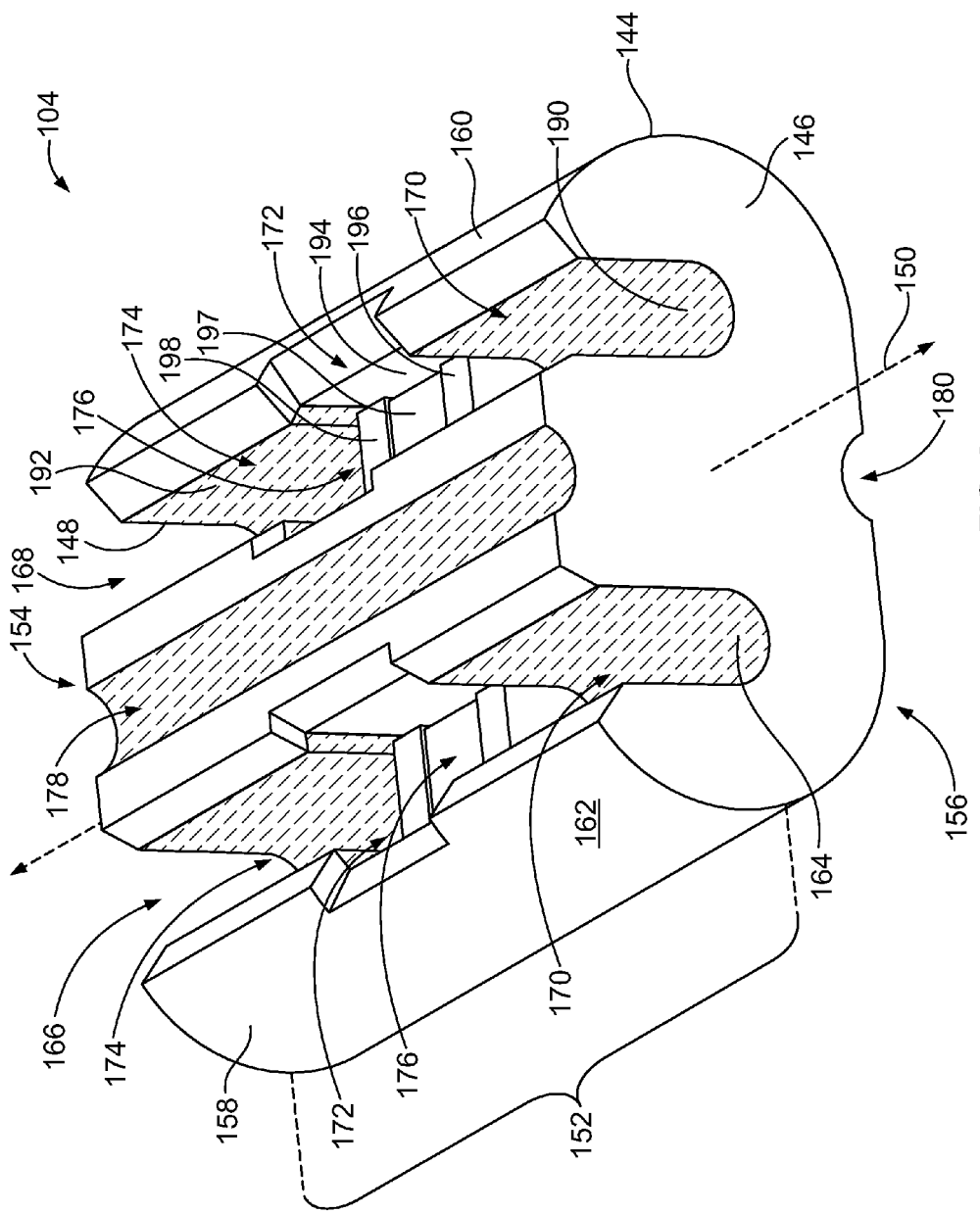
FIG. 3 is an isolated perspective view of the circuit carrier of FIG. 1.

FIG. 3 is an isolated view of the circuit carrier 104. In the illustrated embodiment, the circuit carrier 104 includes a carrier body or housing 144 having a leading body end 146 and a trailing body end 148. The leading and trailing body ends 146, 148 face in opposite directions. A central axis 150 extends longitudinally through a center of the carrier body 144 between the leading and trailing body ends 146, 148. A length 152 of the carrier body 144 extends between the leading and trailing body ends 146, 148. The carrier body 144 also includes longitudinal sides 154, 156 that face in opposite directions and extend between the leading and trailing body ends 146, 148 along the central axis 150. The carrier body 144 also includes contoured sidewalls 158, 160 that face in generally opposite directions and extend between the leading and trailing body ends 146, 148 along the central axis 150.

In some embodiments, the carrier body 144 has an exterior surface 162 that extends along the contoured sidewalls 158, 160 and at least portions of the longitudinal sides 154, 156. The exterior surface 162 may be configured to define an outer contour or envelope of the carrier body 144 that is similar in size and shape to an outer contour of the shield layer 120 (FIG. 1). In other embodiments, the exterior surface 162 may be configured to define an outer contour or envelope of the carrier body 144 that is similar in size and shape to an outer contour of the cable jacket 122 (FIG. 1). When the carrier body 144 is positioned in-line between the communication cable 102 (FIG. 1) and the cable extension 124 (FIG. 1), the cable assembly 100 (FIG. 1) may have a corresponding outer contour that is substantially uniform. In other embodiments, however, the exterior surface 162 may define an outer contour that is larger or smaller than the outer contour of the shield layer 120 and/or the cable jacket 122.

The carrier body 144 may comprise a non-conductive material, such as a ceramic material or polymer material, that is shaped to include the features set forth herein. For example, the carrier body 144 may be molded. After forming the carrier body 144, designated areas of the carrier body 144 may be metalized to define conductive surfaces. For example, a conductive material 164, such as a gold or copper alloy, may be applied to surfaces of the carrier body 144. Non-limiting examples of the conductive material 164 include gold, copper alloy, tin, tin/lead alloy, and/or other precious metals. It should be understood that the location of a metalized area, size of the area, and/or thickness of the area may be configured to achieve a designated performance.

The circuit carrier 104 includes first and second signal pathways 166, 168 that extend longitudinally parallel to the central axis 150. The first and second signal pathways 166, 168 may be defined, in part, by the conductive material 164. As shown, each of the first and second signal pathways 166, 168 is shaped to include channel portions of the carrier body 144. For example, each of the first and second signal pathways 166, 168 includes a leading channel portion 170, a component-receiving portion 172, and a trailing channel portion 174. The leading channel portions 170 of the first and second signal pathways 166, 168 are sized and shaped to receive the exposed segments 131, 133 (FIG. 1), respectively. The component-receiving portions 172 of the first and second signal pathways 166, 168 are sized and shaped to receive corresponding signal-control components 176. The trailing channel portions 174 of the first and second signal pathways 166, 168 are sized and shaped to receive the exposed segments 111, 113 (FIG. 1), respectively.

Also shown in FIG. 3, the carrier body 144 includes a ground channel 178 along the longitudinal side 154 and a ground channel 180 along the longitudinal side 156. Each of the ground channels 178, 180 is sized and shaped to receive a drain wire, such as the drain wire 118 (FIG. 1). In the illustrated embodiment, the ground channels 178, 180 extend parallel to the central axis 150 along the entire length 152 of the carrier body 144. In other embodiments, either or both of the ground channels 178, 180 may extend along only a portion of the length 152.

Each of the first and second signal pathways 166, 168 is open-sided along the longitudinal side 154. In such embodiments, the first and second signal pathways 166, 168 may be accessed along the longitudinal side 154 for inserting the corresponding signal-control components 176 or for electrically coupling the corresponding exposed segments thereto. In other embodiments, one or both of the first and second signal pathways 166, 168 may be open-sided along the longitudinal side 156. In alternative embodiments, the first and second signal pathways 166, 168 (or portions thereof) are not open-sided along either of the longitudinal sides 154, 156. For example, the first and second signal pathways 166, 168 may be tunnel-shaped and extend through the carrier body 144 between the leading and trailing body ends 146, 148.

Each of the first and second signal pathways 166, 168 includes the conductive material 164 and one of the signal-control components 176. More specifically, each of the first and second signal pathways 166, 168 includes a leading conductive surface 190 and a trailing conductive surface 192 that are formed from the conductive material 164. The leading and trailing conductive surfaces 190, 192 do not contact each other directly. Instead, the leading and trailing conductive surfaces 190, 192 are separated by a non-conductive surface 194 of the component-receiving portion 172. Each of the signal-control components 176 includes opposite leading and trailing terminals 196, 198 and a component body 197 extending between the leading and trailing terminals 196, 198. The component body 197 is disposed between the leading and trailing conductive surfaces 190, 192. The leading and trailing terminals 196, 198 are electrically coupled to the leading and trailing conductive surfaces 190, 192, respectively.

The leading conductive surfaces 190 of the first and second signal pathways 166, 168 are configured to electrically couple to the exposed segments 131, 133 (FIG. 1), respectively. The trailing conductive surfaces 192 of the first and second signal pathways 166, 168 are configured to electrically couple to the exposed segments 111, 113 (FIG. 1), respectively. Conductive surfaces may be electrically coupled to corresponding exposed segments of signal conductors in one or more manners. For example, the exposed segments may be soldered to the corresponding conductive surfaces. As another example, a conductive adhesive or epoxy may be used to electrically couple the exposed segments to the corresponding conductive surfaces. In other embodiments, the exposed segments may be held against the conductive surfaces without soldering or using an adhesive. For example, the circuit carrier 104 may include a carrier cover (not shown) that is mounted to the carrier body 144. The carrier cover may include walls that are sized and shaped to be inserted into corresponding channel portions of the carrier body 144. The walls may engage and press the corresponding exposed segments against the corresponding conductive surfaces to maintain the electrical connection.

In some embodiments, the carrier body 144 may be capable of having different orientations with respect to the communication cable 102 (FIG. 1) and the cable extension 124 (FIG. 1). For example, in the illustrated embodiment, the leading body end 146 is configured interface with the cable extension 124, and the trailing body end 148 is configured to interface with the communication cable 102. However, the carrier body 144 may be capable of being re-oriented such that the leading body end 146 interfaces with the communication cable 102 and the trailing body end 148 interfaces with the cable extension 124. Moreover, the carrier body 144 may be rotated 180° about the central axis 150. Such embodiments may facilitate manufacture of the cable assembly 100 (FIG. 1). In other embodiments, however, the carrier body 144 may be only suitable for one orientation.

FIGS. 4 and 5 are cross-sectional views of portions of the cable assembly 100 and illustrate the second signal pathway 168 in greater detail. Although the following is with specific reference to the second signal pathway 168, the description may also be applied to the first signal pathway 166 (FIG. 3). FIG. 4 is a cross-sectional view taken through the leading channel portion 170, and FIG. 5 is a cross-sectional view taken through the component-receiving portion 172.

With respect to FIG. 4, the leading and trailing terminals 196, 198 of the signal-control component 176 are electrically coupled to the leading and trailing conductive surfaces 190, 192, respectively. The exposed segment 133 is electrically coupled to the leading conductive surface 190, and the exposed segment 113 is electrically coupled to the trailing conductive surface 192. In some embodiments, the exposed segment 133 may abut the leading terminal 196, and the exposed segment 113 may abut the trailing terminal 198. In other embodiments, the exposed segment 133 may be spaced apart from the leading terminal 196, and/or the exposed segment 113 may be spaced apart from the trailing terminal 198.

The component body 197 extends through the component-receiving portion 172 and joins the leading and trailing terminals 196, 198. In the illustrated embodiment, the component-receiving portion 172 is defined, in part, by terminal-engaging walls 202, 204. The terminal-engaging walls 202, 204 oppose each other and face in respective opposite directions along the central axis 150. The leading and trailing conductive surfaces 190, 192 may extend along the terminal-engaging walls 202, 204, respectively. The terminal-engaging walls 202, 204 are substantially U-shaped. The non-conductive surface 194 extends between the terminal-engaging walls 202, 204 along the component-receiving portion 172 such that the leading and trailing conductive surfaces 190, 192 are electrically separated from each other. FIG. 5 more clearly illustrates the shape of the component-receiving portion 172 of the second signal pathway 168 relative to the signal-control component 176 and the non-conductive surface 194 extending from the terminal-engaging wall 204. As shown, the non-conductive surface 194 is also U-shaped and extends around the signal-control component 176.

Returning to FIG. 4, during assembly of the cable assembly 100, the signal-control component 176 may be inserted into the component-receiving portion 172. In an exemplary embodiment, the leading and trailing terminals 196, 198 are directly coupled to the leading and trailing conductive surfaces 190, 192, respectively, along the terminal-engaging walls 202, 204, respectively. In some embodiments, the leading and trailing terminals 196, 198 may frictionally engage the leading and trailing conductive surfaces 190, 192, respectively, when the signal-control component 176 is inserted into the component-receiving portion 172. More specifically, the signal-control component 176 may be press-fit with respect to the carrier body 144. Alternatively or in addition to the frictional engagement, the leading and trailing terminals 196, 198 may be soldered to or adhered to the leading and trailing conductive surfaces 190, 192, respectively. Accordingly, the signal-control component 176 may be secured to the carrier body 144 while electrically coupling the leading and trailing conductive surfaces 190, 192.

In the illustrated embodiment, the signal-control component 176 is a passive component, such as a decoupling capacitor. In such embodiments, the component body 197 may constitute a multilayer ceramic chip. In other embodiments, however, the signal-control component 176 may be an inductor, resistor, or other circuitry that is capable of passively modifying the data signals transmitted through the second signal pathway 168. In alternative embodiments, the signal-control component 176 may be an active component.

FIG. 6 is a perspective view of the cable assembly 100 having an optional cable ferrule 206. After the circuit carrier 104 (FIG. 1) has been electrically coupled to the communication cable 102 and the cable extension 124, the cable ferrule 206 may be positioned alongside the circuit carrier 104, the communication cable 102, and the cable extension 124. The cable ferrule 206 may comprise a rigid sheet of conductive material, such as copper. In some embodiments, the cable ferrule 206 is mechanically deformed, such as through a crimping process, to surround the circuit carrier 104 and grip the communication cable 102 and the cable extension 124. Once mechanically deformed, the cable ferrule 206 may grip the shield layer 120 of the communication cable 102 and the shield layer 140 of the cable extension 124. In such embodiments, the cable ferrule 206 may not only substantially maintain the continuity of the electrical shielding, but may also protect the cable assembly 100 from inadvertent separation during usage. The cable ferrule 206 may also protect the circuit carrier 104 (FIG. 1) from damage.

Figure 7:
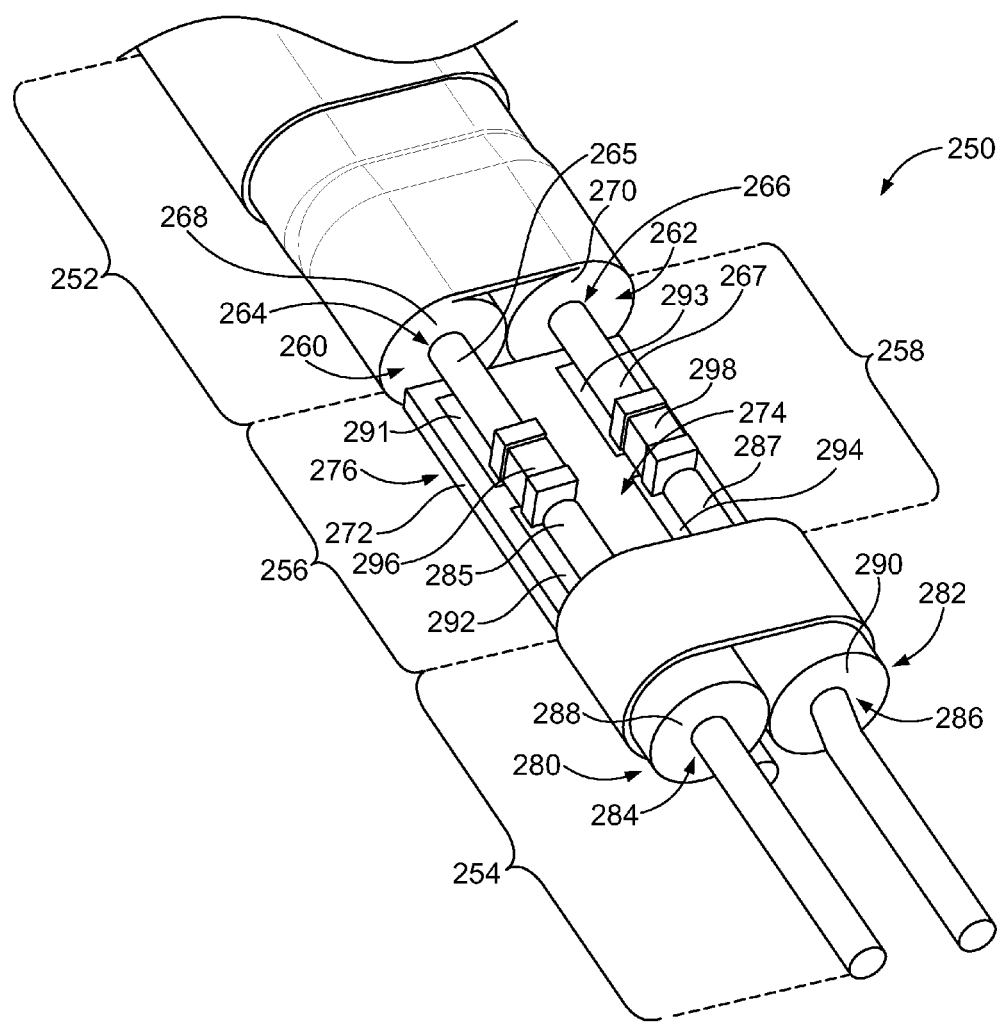
FIG. 7 illustrates a perspective view of a portion of a cable assembly formed in accordance with an embodiment including a circuit carrier.

FIG. 7 illustrates a perspective view of a portion of a cable assembly 250 formed in accordance with an embodiment. The cable assembly 250 may include elements and features that are similar to the elements and features of the cable assembly 100 (FIG. 1). For example, the cable assembly 250 includes a communication cable 252 and a cable extension 254 that are electrically coupled by a circuit carrier 256 that is positioned in-line between the communication cable 252 and the cable extension 254. More specifically, the circuit carrier 256 is positioned within a gap 258 that separates the communication cable 252 and the cable extension 254.

The communication cable 252 includes first and second insulated wires 260, 262 having respective signal conductors 264, 266 and respective insulation layers 268, 270. The signal conductors 264, 266 clear the insulation layers 268, 270, respectively, to form exposed segments 265, 267, respectively, that extend into the gap 258. Similarly, the cable extension 254 includes first and second insulated wires 280, 282 having respective signal conductors 284, 286 and respective insulation layers 288, 290. The signal conductors 284, 286 clear the insulation layers 288, 290, respectively, to form exposed segments 285, 287, respectively, that extend into the gap 258.

The circuit carrier 256 includes a carrier body 272. In the illustrated embodiment, the carrier body 272 is a printed circuit, such as a printed circuit board or a flex circuit, and is hereinafter referred to as the printed circuit 272. The printed circuit 272 has opposite side surfaces 274, 276 with a thickness of the printed circuit 272 defined therebetween. The printed circuit 272 includes circuit traces 291, 292, 293, 294. The circuit traces 291, 293 may constitute trailing conductive surfaces, and the circuit traces 292, 294 may constitute leading conductive surfaces. The circuit traces 291, 292 are aligned with each other and configured to couple to the exposed segments 265, 285, respectively. The circuit traces 293, 294 are aligned with each other and configured to couple to the exposed segments 267, 287, respectively.

Also shown, the circuit carrier 256 includes signal-control components 296, 298 that are coupled to the printed circuit 272 along the side surface 274. The signal-control components 296, 298 may be similar or identical to the signal-control components 176 (FIG. 3). The signal-control component 296 extends between and electrically couples the circuit traces 291, 292, and the signal-control component 298 extends between and electrically couples the circuit traces 293, 294.

Figure 8:
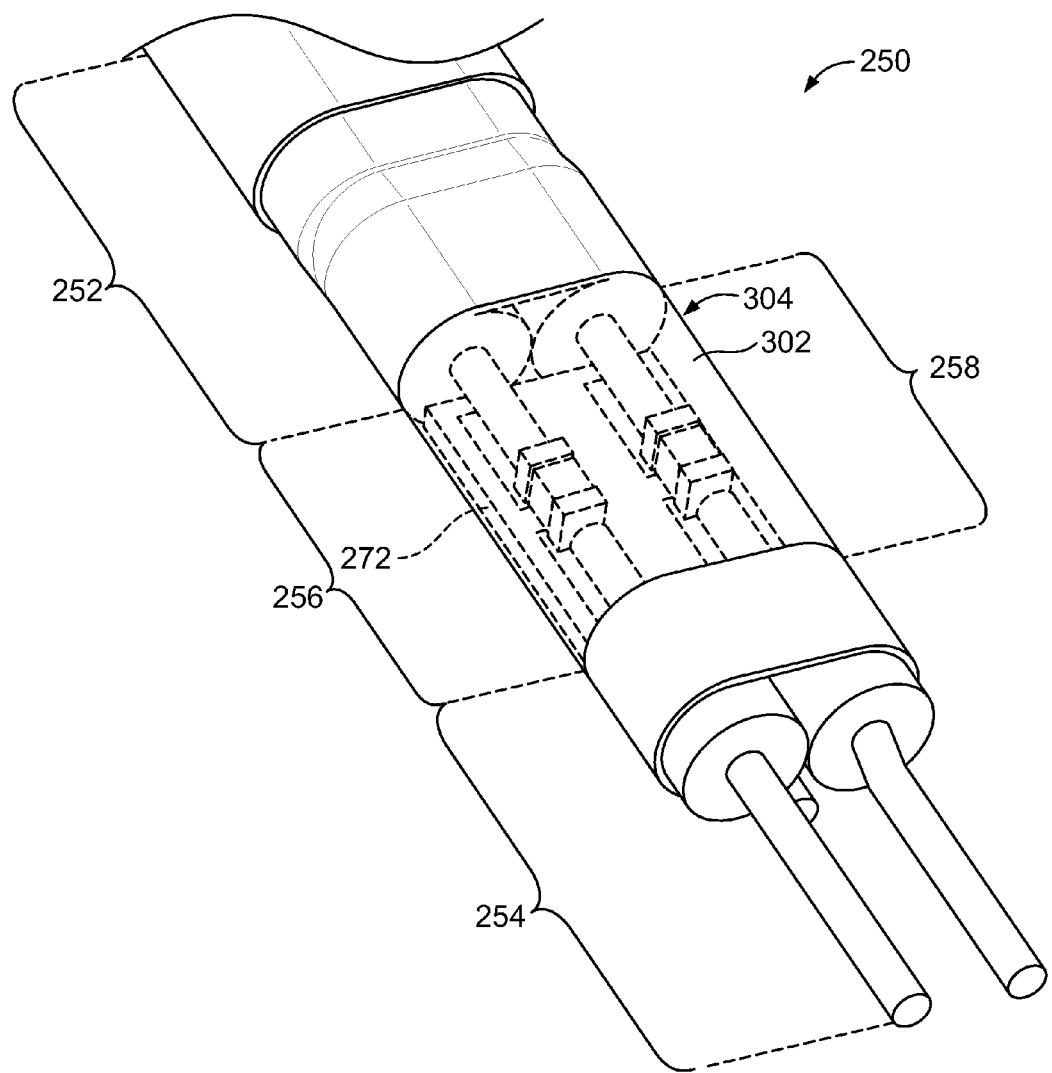
FIG. 8 is a perspective view of the cable assembly including an overmold.

FIG. 8 is a perspective view of the cable assembly 250 after an overmolding process. After the electrical connections have been made using the printed circuit 272, the printed circuit 272 may undergo an overmolding process in which a non-conductive material, such as a polymer, is molded around the printed circuit 272 within the gap 258. Accordingly, a molded body 302 of the circuit carrier 256 is formed around the printed circuit 272. The molded body 302 has an outer surface 304 that may define an outer contour of the circuit carrier 256. In embodiments having the molded body 302, a size and shape of the outer contour may be more precisely controlled. Although not shown, portions of the molded body 302 may extend over the communication cable 252 and the cable extension 254 to more securely join the communication cable 252 and the cable extension 254. Optionally, a cable ferrule (not shown) may be applied to the communication cable 252, the molded body 302, and the cable extension 254 in a similar manner as described above with respect to the cable ferrule 206 (FIG. 6).

Figure 9:
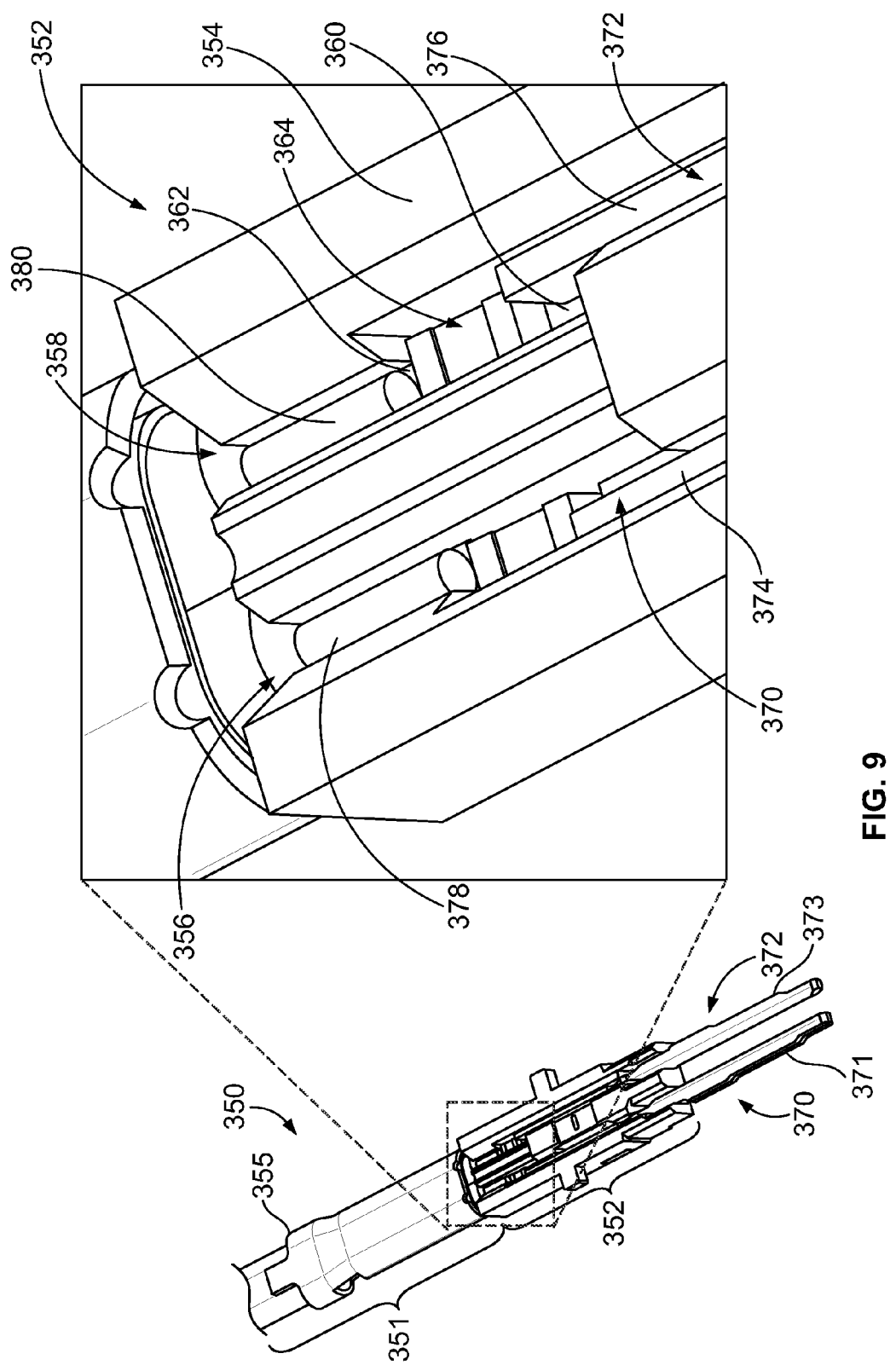
FIG. 9 illustrates a perspective view of an end portion of a cable assembly formed in accordance with an embodiment.

FIG. 9 illustrates a perspective view of an end portion of a cable assembly 350 formed in accordance with an embodiment. The cable assembly 350 may include elements and features that are similar to the elements and features of the cable assembly 100 (FIG. 1) and the cable assembly 250 (FIG. 7). For example, the cable assembly 350 includes a communication cable 351 and a circuit carrier 352. Optionally, the cable assembly 350 includes a cable ferrule 355 that surrounds the communication cable 351.

Also shown in FIG. 9, the cable assembly 350 includes first and second signal conductors 370, 372 that are electrically coupled to the communication cable 351 by the circuit carrier 352. In an exemplary embodiment, the first and second signal conductors 370, 372 are first and second signal contacts, respectively, that are configured to engage electrical contacts (not shown) of an electrical connector (not shown). For example, the first and second signal conductors 370, 372 include mating ends 371, 373, respectively, that project from the circuit carrier 352. The mating ends 371, 373 are configured to terminate to corresponding electrical contacts. For example, the mating ends 371, 373 may be pluggably inserted into corresponding socket contacts or soldered to the electrical contacts. Alternatively, the mating ends 371, 373 may be attached directly to a circuit board.

As shown in the enlarged view of FIG. 9, the circuit carrier 352 includes a carrier body 354 and first and second signal pathways 356, 358. The carrier body 354 and the first and second signal pathways 356, 358 may be manufactured in a similar manner as described above with respect to the circuit carrier 104 (FIG. 1). For example, each of the first and second signal pathways 356, 358 includes a leading conductive surface 360 and a trailing conductive surface 362 that are separated from each other. Each of the first and second signal pathways 356, 358 also includes a signal-control component 364 that electrically couples the separated leading and trailing conductive surfaces 360, 362. The first and second signal conductors 370, 372 include loading ends 374, 376, respectively, that are electrically coupled to the corresponding leading conductive surfaces 360 of the first and second signal pathways 356, 358, respectively. The trailing conductive surfaces 362 of the first and second signal pathways 356, 358 are electrically coupled to signal conductors 378, 380, respectively, of the communication cable 351.

Figure 10:
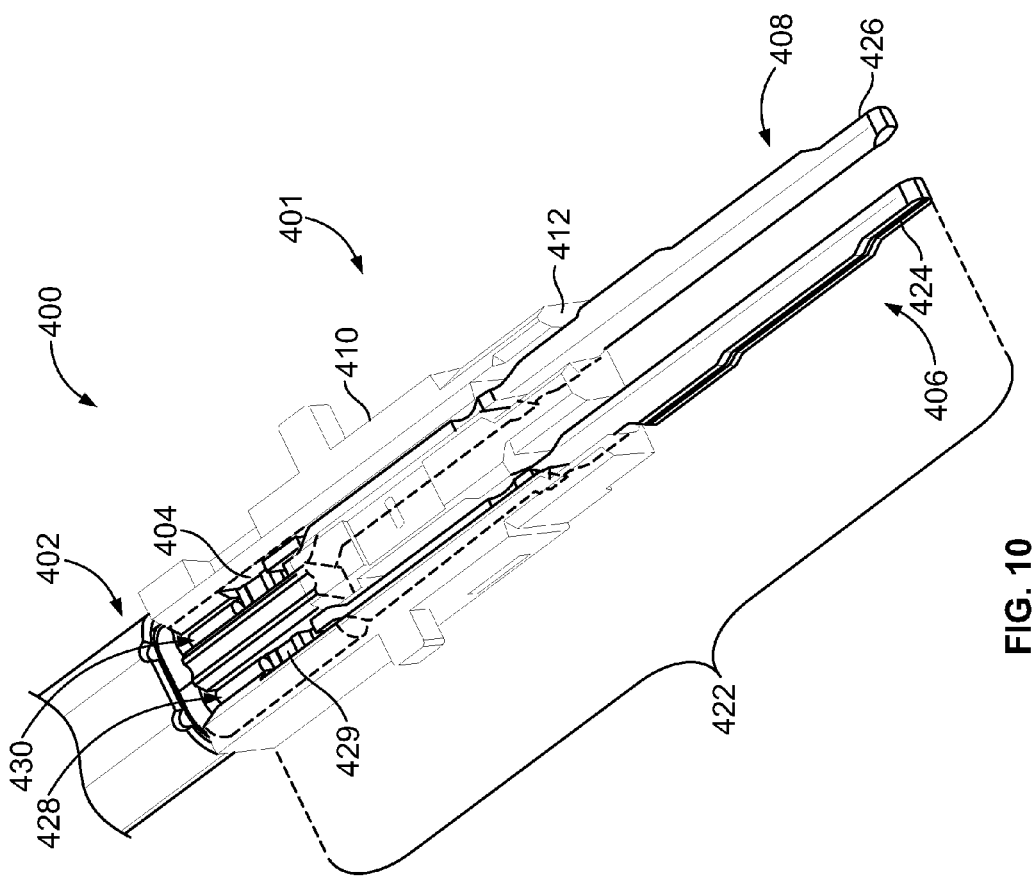
FIG. 10 illustrates a perspective view of an end portion of a cable assembly formed in accordance with an embodiment.

FIG. 10 illustrates a perspective view of an end portion 401 of a cable assembly 400 formed in accordance with an embodiment. The cable assembly 400 may include elements and features that are similar to the elements and features of the cable assembly 100 (FIG. 1), the cable assembly 250 (FIG. 7), and the cable assembly 350 (FIG. 9). For example, the cable assembly 400 includes a communication cable 402 and a circuit carrier 404. The cable assembly 400 also includes first and second signal conductors 406, 408 that are electrically coupled to the communication cable 402 through the circuit carrier 404 as described herein with respect to other circuit carriers. The circuit carrier 404 may be similar or identical to the circuit carrier 104 (FIG. 1). For example, the circuit carrier 404 includes first and second signal pathways 428, 430, that each include a signal-control component 429. The first and second signal pathways 428, 430 may be similar or identical to the first and second signal pathways 166, 168 (FIG. 3), respectively, of the circuit carrier 104.

The cable assembly 400 also includes a module housing 410 that is configured to hold the circuit carrier 404 and the first and second signal conductors 406, 408 in fixed positions with respect to one another. In some embodiments, the module housing 410 provides additional support for holding the first and second signal conductors 406, 408. For example, unlike the circuit carrier 404, the module housing 410 may hold substantial portions of the lengths of the signal conductors 406, 408. In FIG. 10, the module housing 410 is shown in phantom to more clearly illustrate the circuit carrier 404 and the first and second signal conductors 406, 408.

Figure 11:
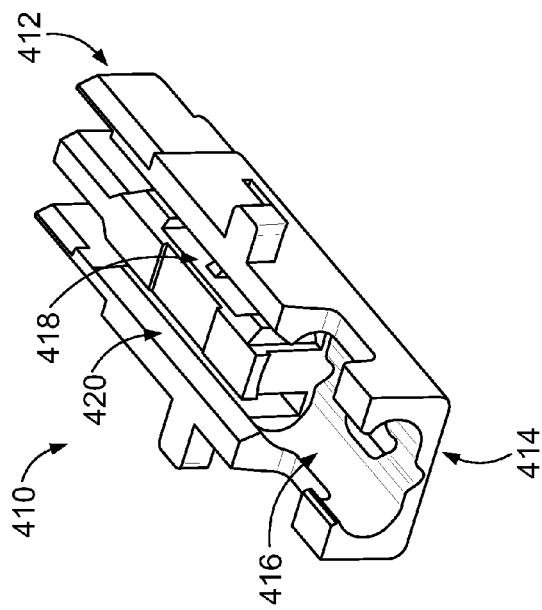
FIG. 11 is an isolated view of a module housing that may be used with the cable assembly of FIG. 10.

FIG. 11 shows an isolated rear perspective view of the module housing 410. The module housing 410 is an elongated structure that extends between a leading end 412 and a trailing end 414. The trailing end 414 is configured to interface with the communication cable 402 (FIG. 10) and the circuit carrier 404 (FIG. 10). As shown, the module housing 410 includes a seating space 416 that is located proximate to the trailing end 414. The seating space 416 is sized and shaped to receive the circuit carrier 404. The module housing 410 also includes first and second slots 418, 420 that are configured to receive the first and second signal conductors 406, 408 (FIG. 10), respectively.

Returning to FIG. 10, the module housing 410 and the first and second signal conductors 406, 408 may form a cable termination 422. The first and second signal conductors 406, 408 are substantially aligned with the first and second signal pathways 428, 430, respectively, of the circuit carrier 404. In an exemplary embodiment, the first and second signal conductors 406, 408 are first and second signal contacts, respectively, that are configured to engage electrical contacts (not shown) of an electrical connector (not shown). For example, the first and second signal conductors 406, 408 include mating ends 424, 426, respectively, that project from the circuit carrier 404 and the leading end 412 of the module housing 410. The mating ends 424, 426 are configured to terminate to corresponding electrical contacts. For example, the mating ends 424, 426 may mate with corresponding socket contacts or be soldered to the electrical contacts. Alternatively, the mating ends 424, 426 may be attached directly to a circuit board.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

What is claimed is:

1. A cable assembly comprising:
a communication cable including first and second insulated wires, each of the first and second insulated wires having a signal conductor and an insulation layer that surrounds the signal conductor; and
a circuit carrier coupled to the communication cable and including separate first and second signal pathways, each of the first and second signal pathways including a leading conductive surface and a trailing conductive surface that are separated from each other, the signal conductors of the first and second insulated wires being coupled to the trailing conductive surfaces of the first and second signal pathways, respectively, the first signal pathway including a corresponding signal-control component that electrically couples the separated leading and trailing conductive surfaces of the first signal pathway, the second signal pathway including a different corresponding signal-control component that electrically couples the separated leading and trailing conductive surfaces of the second signal pathway.

2. The cable assembly of claim 1, further comprising first and second signal conductors coupled to the leading conductive surfaces of the first and second signal pathways, respectively, such that the first signal conductor and the signal conductor of the first insulated wire are electrically coupled through the corresponding signal-control component and the second signal conductor and the signal conductor of the second insulated wire are electrically coupled through the different corresponding signal-control component.

3. The cable assembly of claim 2, wherein the first signal conductor, the signal conductor of the first insulated wire, and the signal-control component of the first signal pathway are substantially aligned with one another, and wherein the second signal conductor, the signal conductor of the second insulated wire, and the signal-control component of the second signal pathway are substantially aligned with one another.

4. The cable assembly of claim 2, further comprising a cable extension that includes a first insulated wire having the first signal conductor and a second insulated wire having the second signal conductor.

5. The cable assembly of claim 4, wherein the communication cable includes a first communication cable and the cable extension includes a second communication cable, the circuit carrier electrically coupling the first and second communication cables to each other.

6. The cable assembly of claim 1, wherein the communication cable comprises a twin-axial cable and the first and second insulated wires are configured for differential signaling.

7. The cable assembly of claim 1, wherein the signal-control components include decoupling capacitors.

8. The cable assembly of claim 1, further comprising a cable ferrule that surrounds the circuit carrier and grips the communication cable.

9. The cable assembly of claim 1, wherein the signal conductors of the first and second insulated wires have respective exposed segments that are electrically coupled to the respective trailing conductive surfaces, the circuit carrier including a carrier body having trailing channel portions, each of the trailing channel portions including one of the trailing conductive surfaces, the trailing conductive surfaces being channel-shaped to partially surround the respective exposed segments.

10. The cable assembly of claim 9, wherein the carrier body comprises a non-conductive material and has metalized areas along a surface of the non-conductive material that form the trailing conductive surfaces.

11. The cable assembly of claim 1, wherein the circuit carrier includes a printed circuit having circuit traces, each of the circuit traces constituting one of the trailing conductive surfaces.

12. The cable assembly of claim 1, wherein the signal conductors of the first and second insulated wires include respective exposed segments that are at least one of (a) soldered to the respective trailing conductive surfaces, (b) directly coupled to the respective trailing conductive surfaces through a conductive adhesive or epoxy, and/or (c) are held against the respective trailing conductive surfaces.

13. The cable assembly of claim 1, wherein the carrier body has opposite leading and trailing ends and wherein a central axis extends between the leading and trailing ends, the carrier body having first and second longitudinal sides that extend between the leading and trailing ends and face in opposite directions, wherein the first and second signal pathways are open-sided along at least one of the longitudinal sides of the carrier body.

14. A cable assembly comprising:
a communication cable including first and second insulated wires, each of the first and second insulated wires having a signal conductor and an insulation layer that surrounds the signal conductor; and
a circuit carrier coupled to the communication cable and including separate first and second signal pathways, each of the first and second signal pathways including a leading conductive surface and a trailing conductive surface that are separated from each other, the signal conductors of the first and second insulated wires being coupled to the trailing conductive surfaces of the first and second signal pathways, respectively, the first signal pathway including a corresponding signal-control component that electrically couples the separated leading and trailing conductive surfaces of the first signal pathway, the second signal pathway including a different corresponding signal-control component that electrically couples the separated leading and trailing conductive surfaces of the second signal pathway; and
first and second signal conductors coupled to the leading conductive surfaces of the first and second signal pathways, respectively, such that the first signal conductor and the signal conductor of the first insulated wire are electrically coupled through the corresponding signal-control component and the second signal conductor and the signal conductor of the second insulated wire are electrically coupled through the different corresponding signal-control component, wherein the first and second signal conductors are first and second signal contacts, respectively, the first and second signal contacts having mating ends that are configured to engage electrical contacts of an electrical connector, the mating ends extending parallel to each other.

15. The cable assembly of claim 14, wherein the mating ends of the first and second signal contacts clear and project away from an end of the circuit carrier, the mating ends configured to be inserted into socket contacts.

16. A circuit carrier configured to couple to a communication cable, the circuit carrier comprising:
a carrier body; and
separate first and second signal pathways coupled to the carrier body and having fixed positions with respect to each other, each of the first and second signal pathways including a leading conductive surface and a trailing conductive surface that are separated from each other, the first signal pathway including a corresponding signal-control component that electrically couples the separated leading and trailing conductive surfaces of the first signal pathway, the second signal pathway including a corresponding signal-control component that electrically couples the separated leading and trailing conductive surfaces of the second signal pathway;
wherein the carrier body has trailing channel portions, each of the trailing channel portions including one of the trailing conductive surfaces, the trailing conductive surfaces being channel-shaped to partially surround exposed segments of respective signal conductors.

17. The circuit carrier of claim 16, further comprising first and second signal contacts having mating ends that project beyond the carrier body wherein the first and second signal contacts are configured to engage electrical contacts of an electrical connector, the first and second signal contacts being coupled to the leading conductive surfaces of the first and second signal pathways, respectively.

18. The circuit carrier of claim 16, wherein the carrier body includes a ground channel that is sized and shaped to receive a drain wire from the communication cable.

19. The circuit carrier of claim 16, wherein the signal-control components include decoupling capacitors that are configured to at least one of: (a) control a flow of current along the corresponding signal pathway; (b) filter the signals along the corresponding signal pathway; (c) reduce reflections; or (d) reduce data transmission losses.

20. The cable assembly of claim 16, wherein the carrier body also has leading channel portions, each of the leading channel portions including one of the leading conductive surfaces, the leading conductive surfaces being channel-shaped to partially surround exposed segments of different respective signal conductors.

* * * * *